United States Patent
Ko et al.

(10) Patent No.: US 7,391,611 B2
(45) Date of Patent: Jun. 24, 2008

(54) HEAT-DISSIPATING DEVICE AND A HOUSING THEREOF

(75) Inventors: Hao-wen Ko, Taipei (TW); Tsung-Yu Lei, Taipei (TW); Kuo-cheng Lin, Taoyuan (TW); Hsiou-chen Chang, Miaoli (TW)

(73) Assignee: Delta Electronics, Inc. (TW)

( * ) Notice: Subject to any disclaimer, the term of this patent is extended or adjusted under 35 U.S.C. 154(b) by 0 days.

(21) Appl. No.: 11/511,985

(22) Filed: Aug. 28, 2006

(65) Prior Publication Data

US 2006/0285295 A1    Dec. 21, 2006

(51) Int. Cl.
*H05K 7/20* (2006.01)
*F04D 29/52* (2006.01)

(52) U.S. Cl. .................. 361/695; 361/694; 361/696; 415/191; 417/354

(58) Field of Classification Search ......... 361/690–697, 361/702–719; 174/15.2, 16.3; 165/121–126, 165/80.3, 185; 415/191, 208.2, 211.2, 176, 415/220, 221, 204, 196, 208.5, 223, 175, 415/177, 178, 213.1; 416/247 R; 417/354, 417/423.14, 423.15, 423.5, 423.8, 424.1
See application file for complete search history.

(56) References Cited

U.S. PATENT DOCUMENTS

| | | | | |
|---|---|---|---|---|
| 4,618,315 A | * | 10/1986 | Papst et al. | 417/354 |
| 4,895,489 A | * | 1/1990 | Kohama et al. | 415/218.1 |
| 4,909,711 A | * | 3/1990 | Burgbacher et al. | 417/354 |
| 5,000,079 A | * | 3/1991 | Mardis | 454/184 |
| 5,407,324 A | * | 4/1995 | Starnes et al. | 415/208.5 |
| 5,695,318 A | * | 12/1997 | Harmsen | 415/218.1 |
| 5,707,205 A | * | 1/1998 | Otsuka | 415/119 |
| 5,943,209 A | * | 8/1999 | Liu | 361/695 |
| 6,328,529 B1 | * | 12/2001 | Yamaguchi et al. | 415/178 |
| 6,332,755 B1 | * | 12/2001 | Fujinaka et al. | 415/208.5 |
| 6,524,067 B1 | * | 2/2003 | Chen et al. | 415/208.5 |
| 6,538,888 B1 | * | 3/2003 | Wei et al. | 361/697 |
| 6,565,334 B1 | * | 5/2003 | Bradbury et al. | 417/423.1 |
| 6,814,542 B2 | * | 11/2004 | Marlander et al. | 415/219.1 |
| 6,927,979 B2 | * | 8/2005 | Watanabe et al. | 361/697 |
| 7,052,236 B2 | * | 5/2006 | Chang et al. | 415/191 |

* cited by examiner

*Primary Examiner*—Michael V Datskovskiy
(74) *Attorney, Agent, or Firm*—Martine Penilla & Gencarella, LLP

(57) ABSTRACT

A heat-dissipating device and a housing thereof. The housing includes a passage for guiding an air stream flowing from an opening to another opening, wherein an sidewall of the passage at least one of the opening sides extends radially outwards with a rotational axis of the heat-dissipating device or the passage so as to enlarge intake or discharge area for the air streams. Accordingly, the intake airflow rate may be greatly increased and the heat-dissipating efficiency of the heat-dissipating device may be greatly enhanced without changing assembling conditions with other elements.

19 Claims, 12 Drawing Sheets

HEAT-DISSIPATING DEVICE AND A HOUSING THEREOF

BACKGROUND OF THE INVENTION

1. Field of the Invention

The invention relates to a heat-dissipating device and a housing thereof, and more particularly to an axial fan having an increased intake airflow rate without modifying the assembling conditions with other elements so as to greatly enhance the heat-dissipating performance of the fan, and a housing for the fan.

2. Description of the Related Art

A typical electrical product usually includes electrical elements positioned in a closed housing in order to prevent the electrical elements from being contaminated with particles in the air. However, since the electrical element (such as a central processing unit (CPU) or circuit board) raises its temperature during operation, the element tends to be consumed and the lifetime thereof tends to be shortened if the element is continuously kept at the high-temperature condition. Thus, a fan is typically disposed in the housing to dissipate heat to the outside in order to prevent the electrical element from failing.

As shown in FIG. 1, a conventional fan 1 is mainly composed of a fan housing 11 and an impeller 12. When the fan is operating, a motor may be used to drive the impeller 12 to rotate and to produce air streams flowing toward the electrical element in order to dissipate the heat generated from the electrical element. The fan housing includes an air inlet and an air outlet in communication with the air inlet via a central, cylindrical air passage 11a. The air streams caused by the impeller 12 may freely flow into and out of the fan housing via the air passage. Furthermore, a plurality of tapered portions 13, through which the air streams may smoothly flow into the air inlet side, are provided at the corners on the air inlet side of the air passage. In addition, a plurality of screw holes 14 is formed at four corners of the fan housing such that the fan may be mounted to a frame of an electrical apparatus (i.e., a computer) via the screw holes 14.

However, due to the restriction in the dimension of the rectangular fan housing of the conventional fan, the air passage at the lateral side has to be reduced. The optimized design in the shape of the blade based on the curve of the air passage is also restricted, and the space and material of the fan housing are also wasted. Besides, due to the restriction in the construction of the fan housing, air may be taken into the fan only in the axial direction. However, it only can achieve very limited improvement effect in the increased intake airflow rate by doing so.

SUMMARY OF THE INVENTION

An object of the invention is to provide a heat-dissipating fan and a housing thereof, wherein an sidewall of the housing extends outwards to enlarge the intake airflow area thereof without modifying the assembling conditions between the existing fan and other heat dissipation elements, and the shape of the housing at the air outlet side is kept unchanged in order to enhance the heat-dissipating efficiency of the fan. The fan may be mounted to a system or other heat dissipation elements without changing the assembling conditions with the system and the heat dissipation elements.

Another object of the invention is to provide a heat-dissipating device and a housing thereof, wherein an sidewall of the housing extends outwards to enlarge its intake airflow area so that the impeller of the heat-dissipating device may increase its dimension with the outward extension of the housing. Thus, the airflow rate may be increased and the heat-dissipating efficiency may be enhanced.

Still another object of the invention is to provide a heat-dissipating fan and a housing thereof, wherein the air passage formed by the sidewall of the passage of the housing reduces gradually and evenly in its cross-sectional area. Thus, the air streams produced by the rotation of blades of the impeller of the heat-dissipating device can be effectively concentrated to the center and then blow to the center portion of the heat sink having the highest temperature when the heat sink is assembled with the heat-dissipating device so as to enhance its heat-dissipating efficiency.

According to the first aspect of the invention, the housing includes an outer frame having a passage for guiding air streams to flow from an opening to another opening, wherein an sidewall of the passage of one of the opening sides extends radially outwards so as to enlarge intake or discharge area for the air streams.

The sidewall of the passage extends radially outwardly with respect to a central axis of the passage in a symmetrical manner. In addition, the sidewall of the passage extends radially outwardly with respect to a longitudinal axis of the passage and beyond the peripheral edge of the outer frame. Alternatively, the sidewall of the passage extends radially outwardly with respect to a longitudinal axis of the passage in a frustum-conical or a frustum-elliptically conical manner.

Preferably, the sidewall of the passage is formed with an inclined portion or a beveled edge there around.

According to the second aspect of the invention, the housing includes an outer frame including an air inlet, an air outlet, and a passage for guiding air streams from the air inlet to the air outlet, wherein an sidewall of the passage at the air inlet side extends radially outwardly so as to enlarge an intake area of the air streams.

Preferably, the sidewall of the passage at the air inlet side extends radially outwardly with respect to a central axis of the passage in a symmetrical manner. Alternatively, the sidewall of the passage at the air inlet side extends radially outwardly with respect to a longitudinal axis of the passage and beyond the peripheral edge of the outer frame. Furthermore, the sidewall of the passage at the air inlet side extends radially outwardly with respect to a longitudinal axis of the passage in a frustum-conical or a frustum-elliptically conical manner.

Preferably, the sidewall of the passage is formed with an inclined portion extending from the air inlet to the air outlet.

Preferably, the radially outward extension of the sidewall of the passage at the air inlet side is partially cut off to form a notch in order to enlarge an intake area for lateral side air streams.

According to the third aspect of the invention, the heat-dissipating device includes an impeller and a housing for receiving the impeller, wherein the housing includes a passage for guiding air streams to flow from an opening to another opening, an sidewall of the passage at least one of the opening sides extends radially outwards so as to enlarge an intake/discharge area for the air streams. A dimension of a blade of the impeller increases along with the radially outwardly extending direction of the sidewall of the passage.

According to the fourth aspect of the invention, the heat-dissipating device includes an impeller and a housing for receiving the impeller, wherein the housing includes an air inlet, an air outlet, and a passage for guiding air streams from the air inlet to the air outlet, and an sidewall of the passage at the air inlet side extends radially outwards so as to enlarge an intake area of the air streams.

According to the fifth aspect of the invention, the heat-dissipating system includes a casing, at least one electrical element mounted within the casing, and a heat-dissipating device mounted on the casing for dissipating heat generated from the at least one electrical element when it operates, wherein the heat-dissipating device includes an impeller and a housing for receiving the impeller. Further, the housing includes a passage for guiding air streams to flow from an opening of the housing to another opening, and an sidewall of the passage at one of the openings extends radially outwardly with respect to a rotational axis of the heat-dissipating device so as to enlarge an intake/discharge area for the air streams.

Preferably, the heat-dissipating device is an axial fan.

Further, the heat-dissipating device includes a heat sink assembled with the housing.

According to the sixth aspect of the invention, the heat-dissipating system includes a casing, at least one electrical element mounted within the casing, and a heat-dissipating device mounted on the casing for dissipating heat generated from the at least one electrical element when it operates, wherein the heat-dissipating device includes an impeller and a housing for receiving the impeller. Further, the housing includes an air inlet, an air outlet, and a passage for guiding air streams to flow from the air inlet to the air outlet, wherein the sidewall of the passage at the air inlet side extends radially outwardly with respect to a rotational axis of the heat-dissipating device so as to enlarge an intake area for the air streams.

Other objects, features, and advantages of the invention will become apparent from the following detailed description of the preferred but non-limiting embodiments. The following description is made with reference to the accompanying drawings.

DETAILED DESCRIPTION OF THE INVENTION

Figure 1:
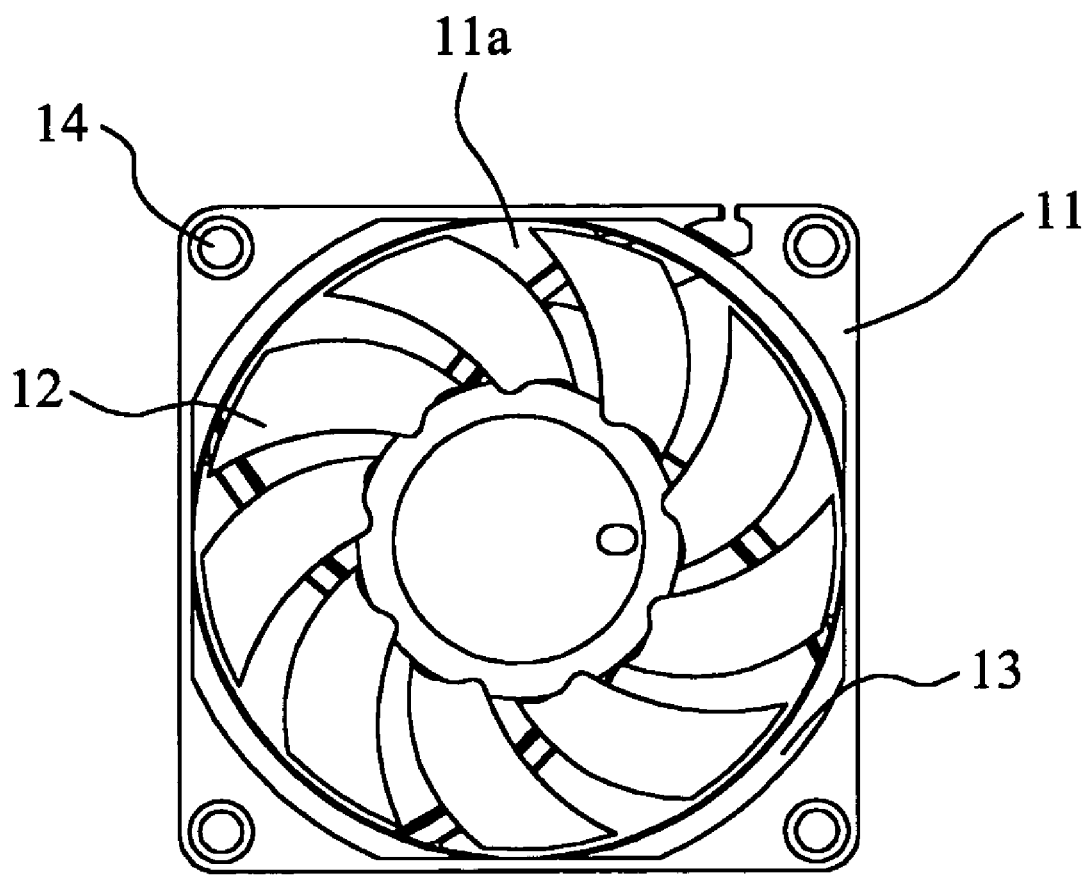
FIG. 1 is a top view showing a conventional fan.
Figure 2A:
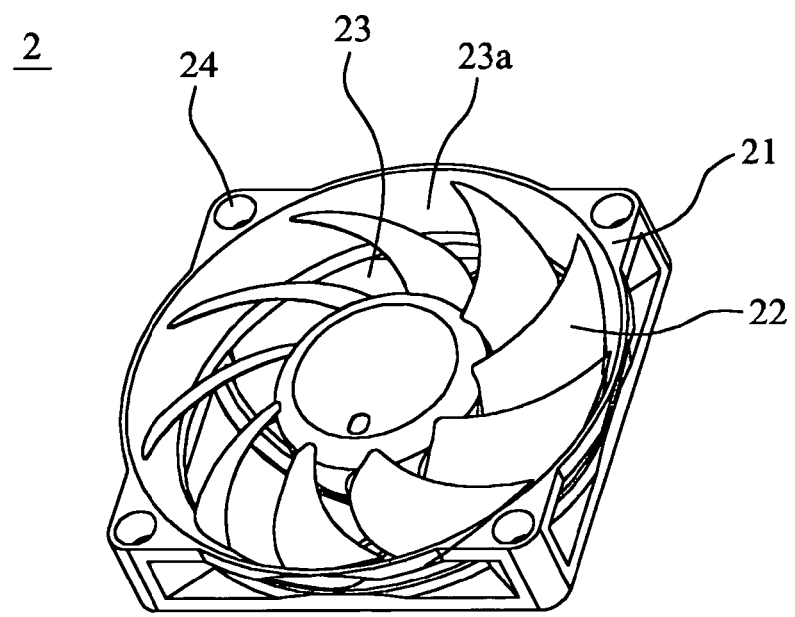
FIG. 2A is a perspective view showing a heat-dissipating device according to a first preferred embodiment of the invention.
Figure 2B:
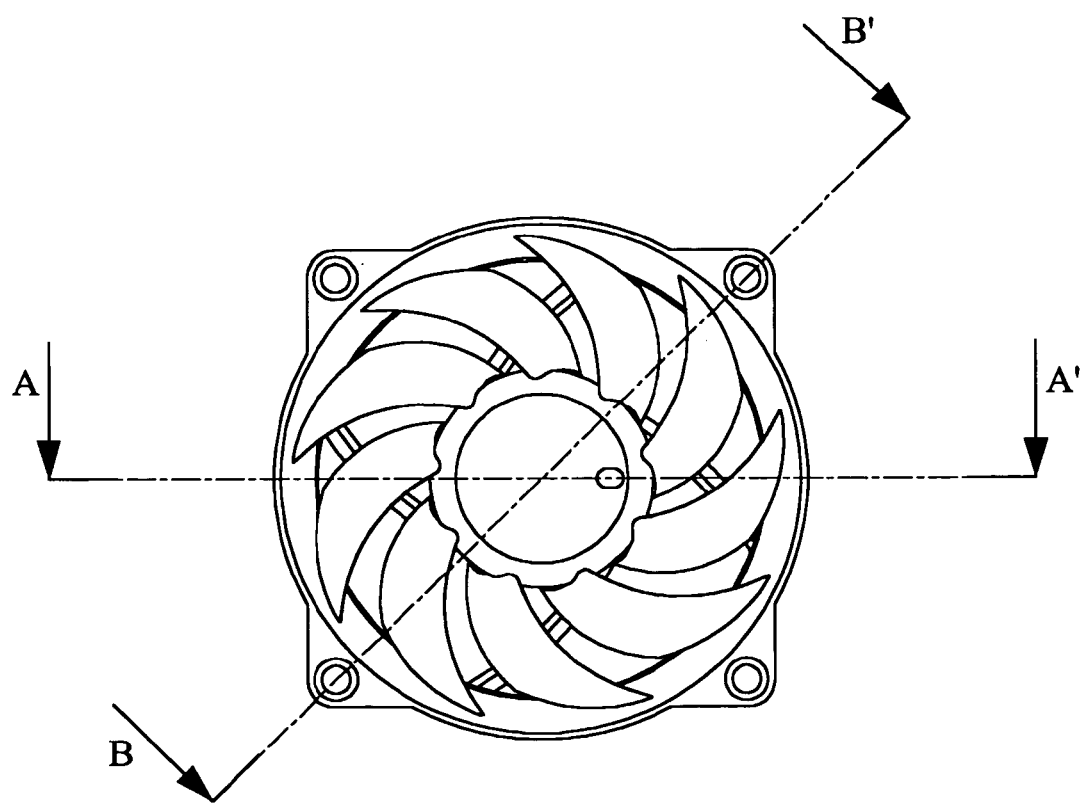
FIG. 2B is a top view showing the heat-dissipating device of FIG. 2A.
Figure 2C:
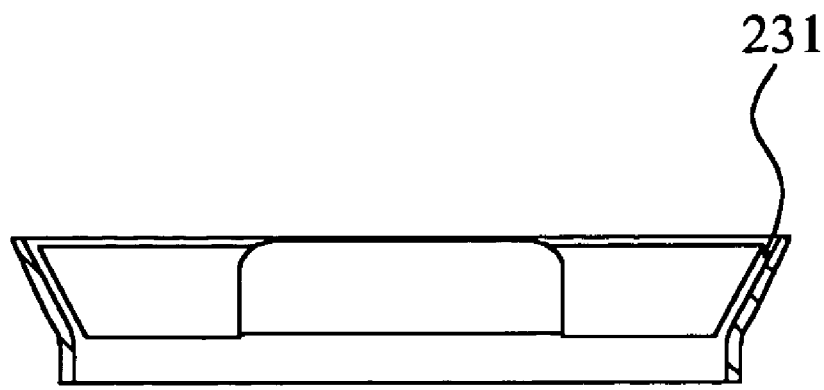
FIG. 2C is a cross-sectional view showing the heat-dissipating device taken along a line A-A' of FIG. 2B.
Figure 2D:
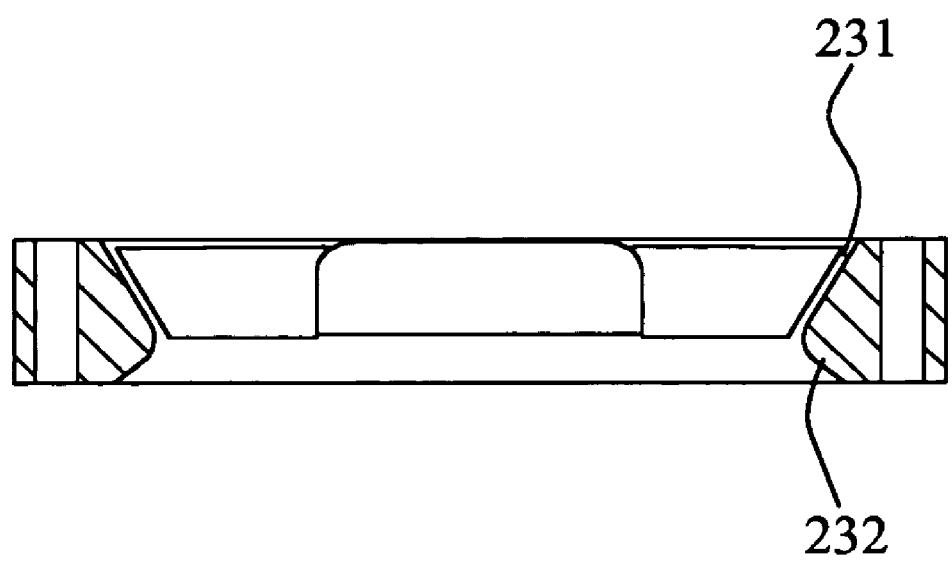
FIG. 2D is a cross-sectional view showing the heat-dissipating device taken along a line B-B' of FIG. 2B.

Referring to FIGS. 2A to 2D, which show a heat-dissipating device according to a first preferred embodiment of the invention. The heat-dissipating device 2 is mainly composed of a housing and an impeller 22. The housing includes a rectangular outer frame 21 having an air inlet, an air outlet, and a passage 23 connecting the air inlet to the air outlet. An sidewall 23a of the passage extends radially outwards with respect to a rotational axis of the fan motor of the heat-dissipating device or an axis of passage, or even protrudes over the rectangular outer frame 21. Since the air inlet side of the housing has a circular shape extending outwards, the bottom part of the housing is still kept as a rectangular shape, and screw holes 24 and their positions are kept unchanged, the way of assembling the housing with other elements is also kept unchanged. The dimension of the blade of the impeller can be enlarged along with the outward extension of the sidewall of the housing, and an inclined portion 231 can be formed at the sidewall of the housing, as shown in FIG. 2C. The inclined portion 231 can greatly enlarge the intake airflow area and reduce noises of the turbulent flow produced owing to uneven intake airflow area of the conventional fan. In addition, an inclined portion 232 can also be designed at the sidewall of the air outlet side of the housing, as shown in FIG. 2D, wherein the inclined portion 232 can significantly increase the heat-dissipating area of the air outlet side.

Figure 3A:
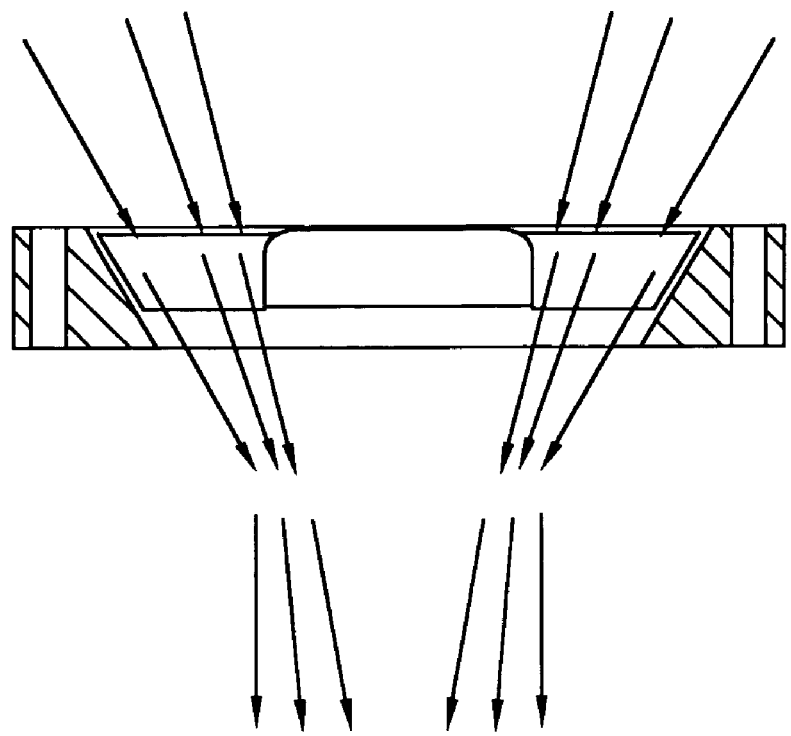
FIGS. 3A and 3B are cross-sectional views showing several modified structures of the housing for the heat-dissipating device of the invention, wherein FIG. 3A also shows the direction of the flow field.
Figure 3B:
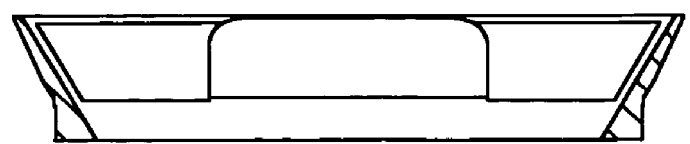

In addition to the designs of inclined portions towards different directions at the sidewall from the air inlet side to the air outlet side, the sidewall may be formed with an inwardly inclined portion from the air inlet side to the air outlet side of the housing, as shown in FIGS. 3A and 3B. In this case, the air streams can be concentrated toward the center to provide better heat-dissipating performance for the heat-dissipating device that requires concentrated air streams. In addition, the fan housing assembly housing may be formed with a beveled edge at the air inlet side around the screw holes so that the intake airflow area can also be enlarged.

Figure 4A:
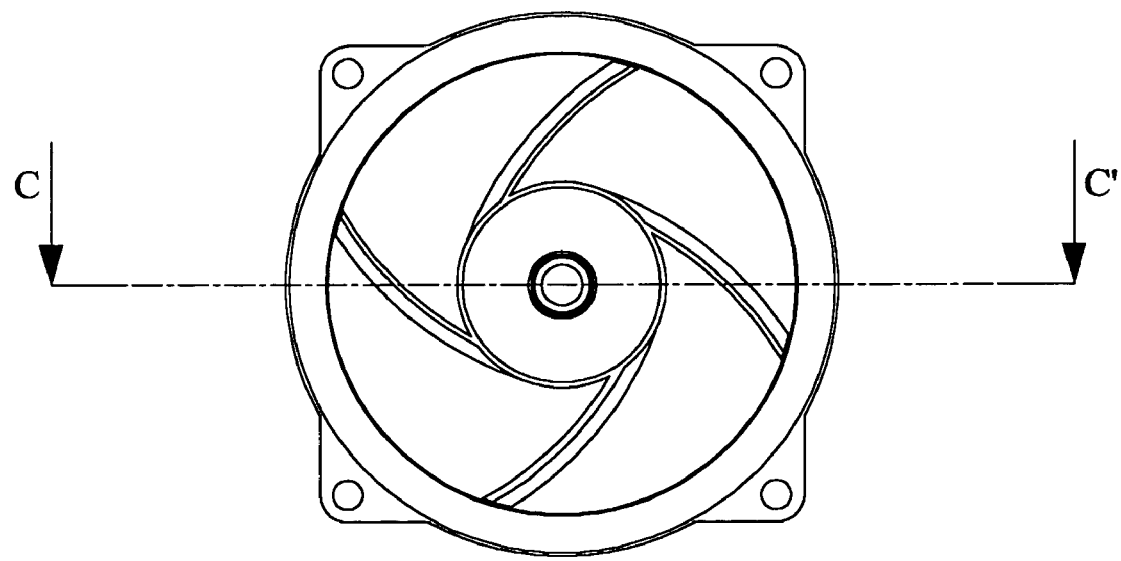
FIG. 4A is a top view showing the housing for the heat-dissipating device according to another preferred embodiment of the invention.
Figure 4B:
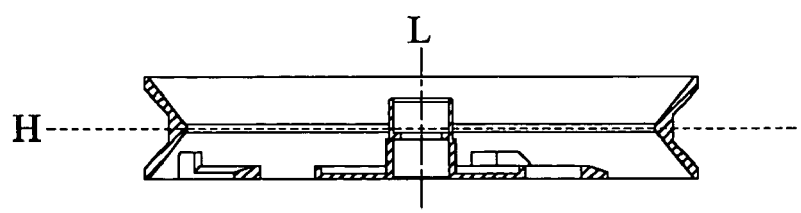
FIG. 4B is a cross-sectional view showing the heat-dissipating device taken along a line C-C' of FIG. 4A.

Furthermore, in addition to the sidewall of the passage at the air inlet side extending radially outwards and protruding over the rectangular outer frame 21, the same designs may be configured at the air outlet side. In other words, the sidewall of the passage at the air outlet side also extends radially outwards and protrudes over the rectangular outer frame 21, as shown in FIGS. 4A and 4B, such that the sidewalls at the air inlet side and the air outlet side have a symmetrical structure with respect to a longitudinal axis L of the air passage including the same axis or a horizontal median plane H of the heat-dissipating device.

Figure 5:
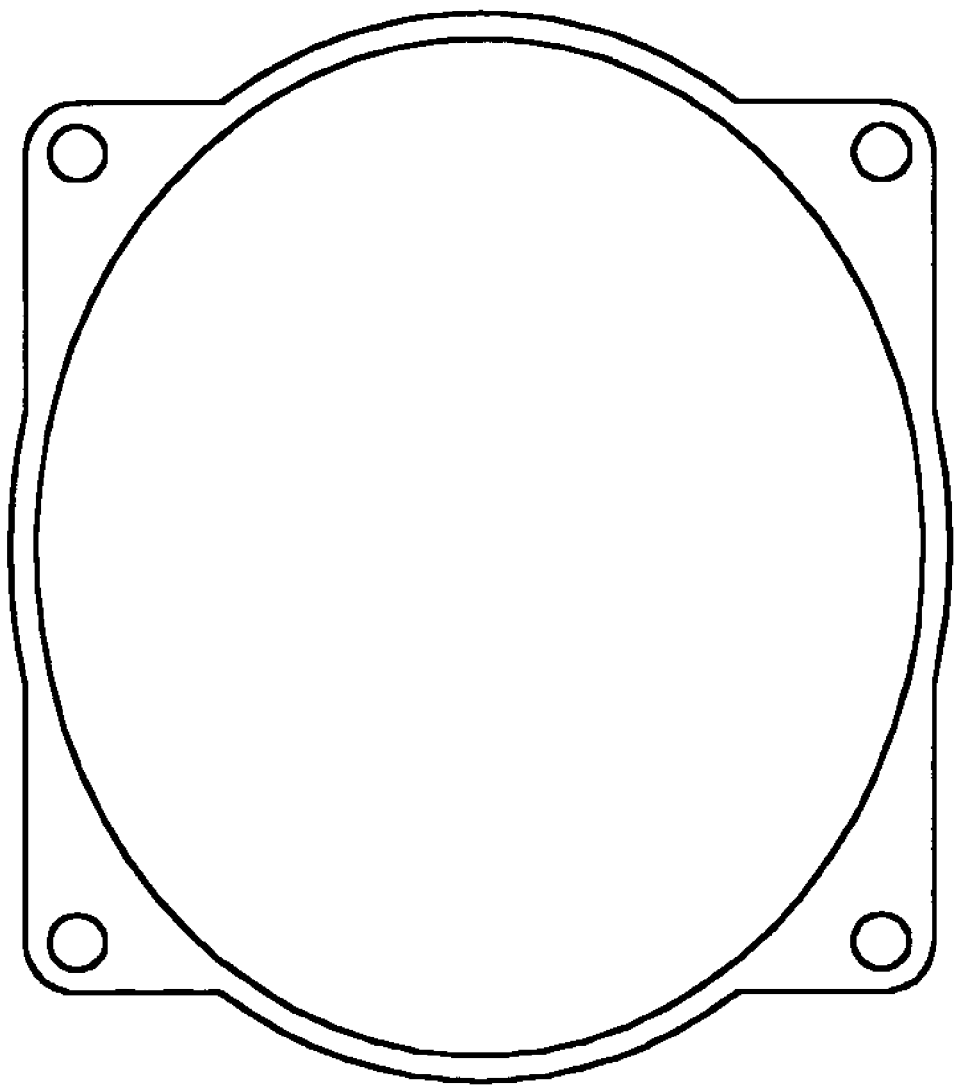
FIG. 5 is a top view showing a housing for the heat-dissipating device according to still another preferred embodiment of the invention.

In addition that the sidewall of the passage at the air inlet side of the housing as shown in FIG. 2A evenly radially extends outwards in a circular manner, it can also be designed into an elliptic shape extending outwards in a symmetrical manner, as shown in FIG. 5. In other words, the sidewall of the passage at the air inlet side of the housing can extend radially outwards in a symmetrical manner with respect to the longitudinal axis L of the air passage, that is, in a right-and-left or upper-and-lower symmetry from the top view of the housing.

Figure 6:
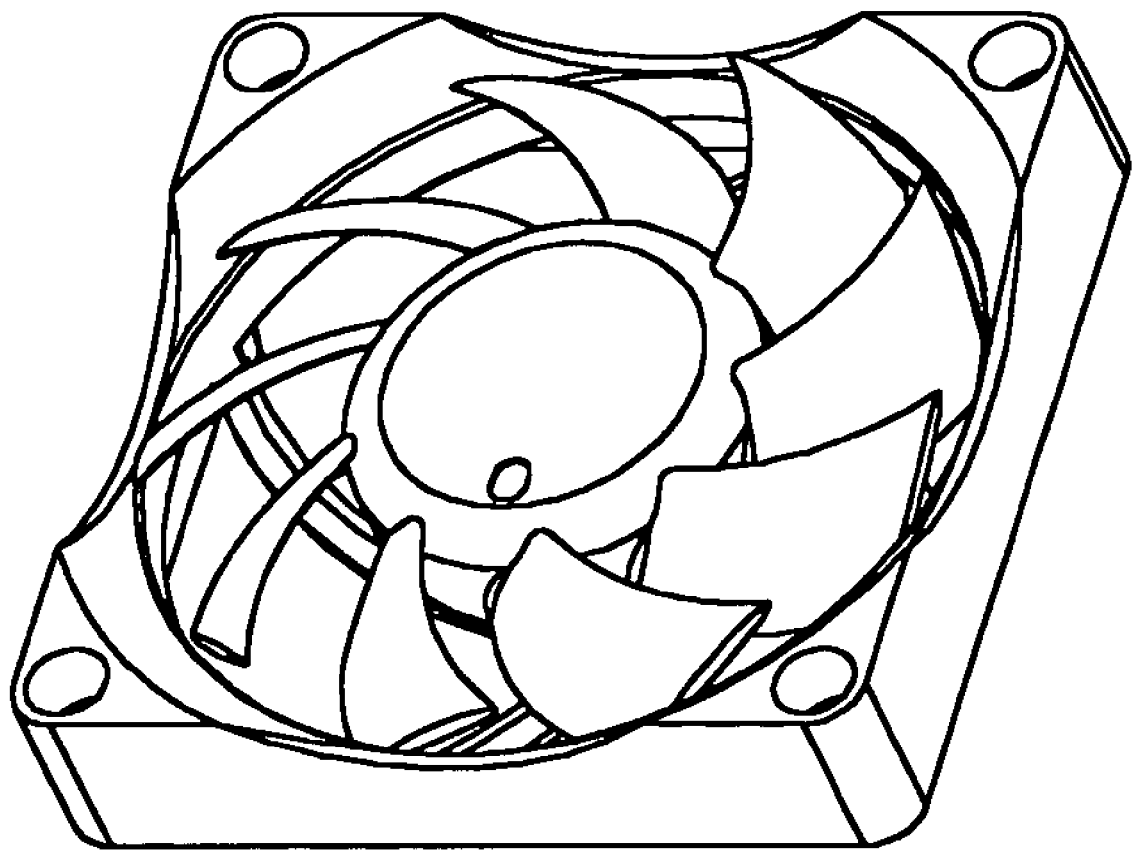
FIG. 6 is a perspective view showing the heat-dissipating device according to another preferred embodiment of the invention.

In addition to the outward extension of the sidewall of the housing, when the lateral side of the housing cannot be extended owing to the dimensional limitation, a part of the side wall of the housing may be cut off to form a notch or notches, as shown in FIG. 6. In this case, the intake airflow area at the lateral side can be enlarged, the air can be smoothly introduced, and the noise can also be reduced.

Figure 7:
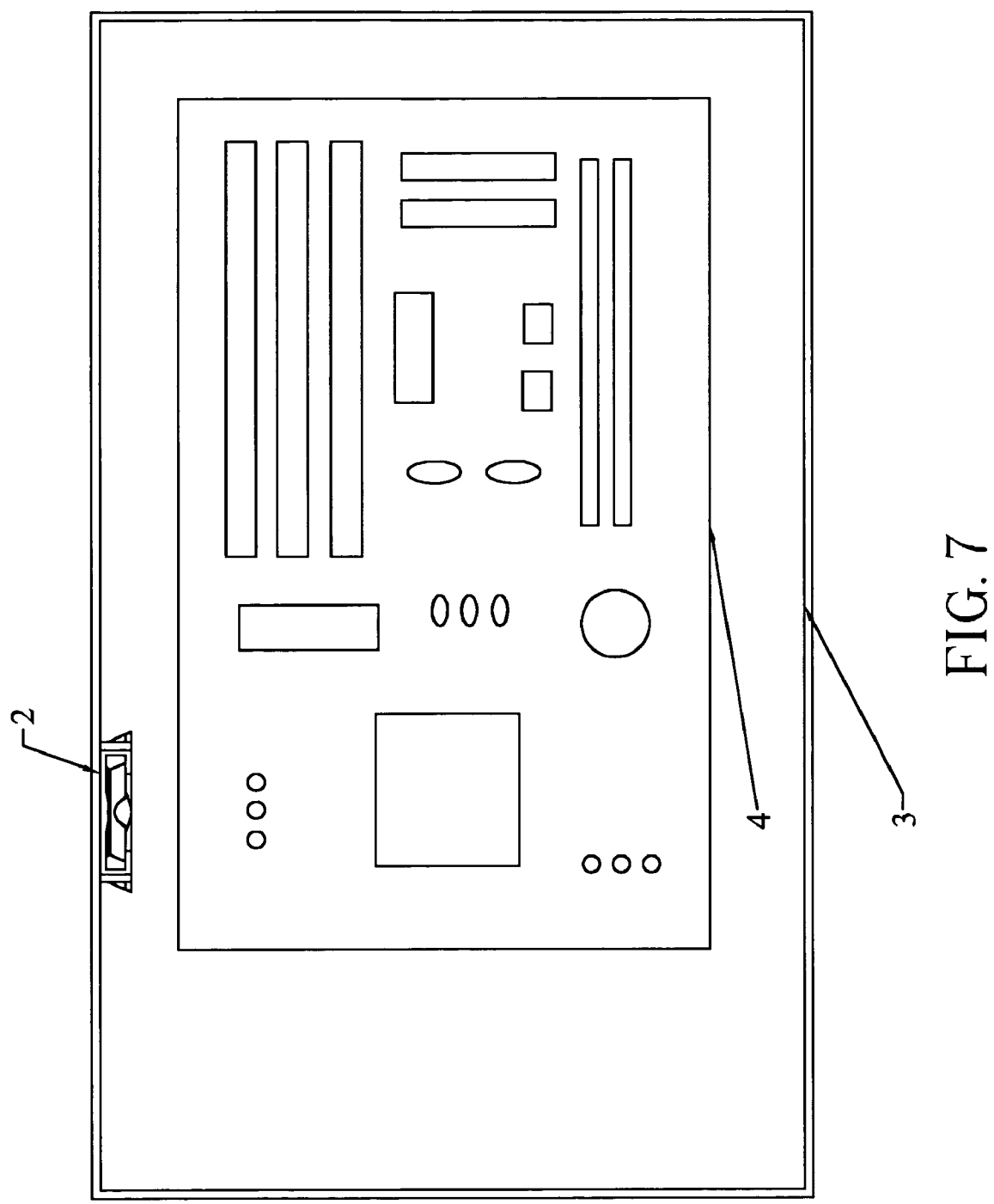
FIG. 7 is a schematic illustration showing the heat-dissipating device of the invention mounted in a system frame having with electrical elements disposed therein.

In practice, the heat-dissipating device 2 may be disposed within a system casing 3 in which electrical elements are mounted, as shown in FIG. 7. Several heat sources or electrical elements, which will generate a lot of heat during operation, are mounted on a circuit board 4. The heat-dissipating device 2 of the invention is mounted to a proper position (close to the heat sources) to discharge air streams toward the heat sources or electrical elements. Thus, the heat-dissipating efficiency can be enhanced, and it is possible to prevent the electrical elements from being damaged owing to high-temperature conditions.

Figure 8A:
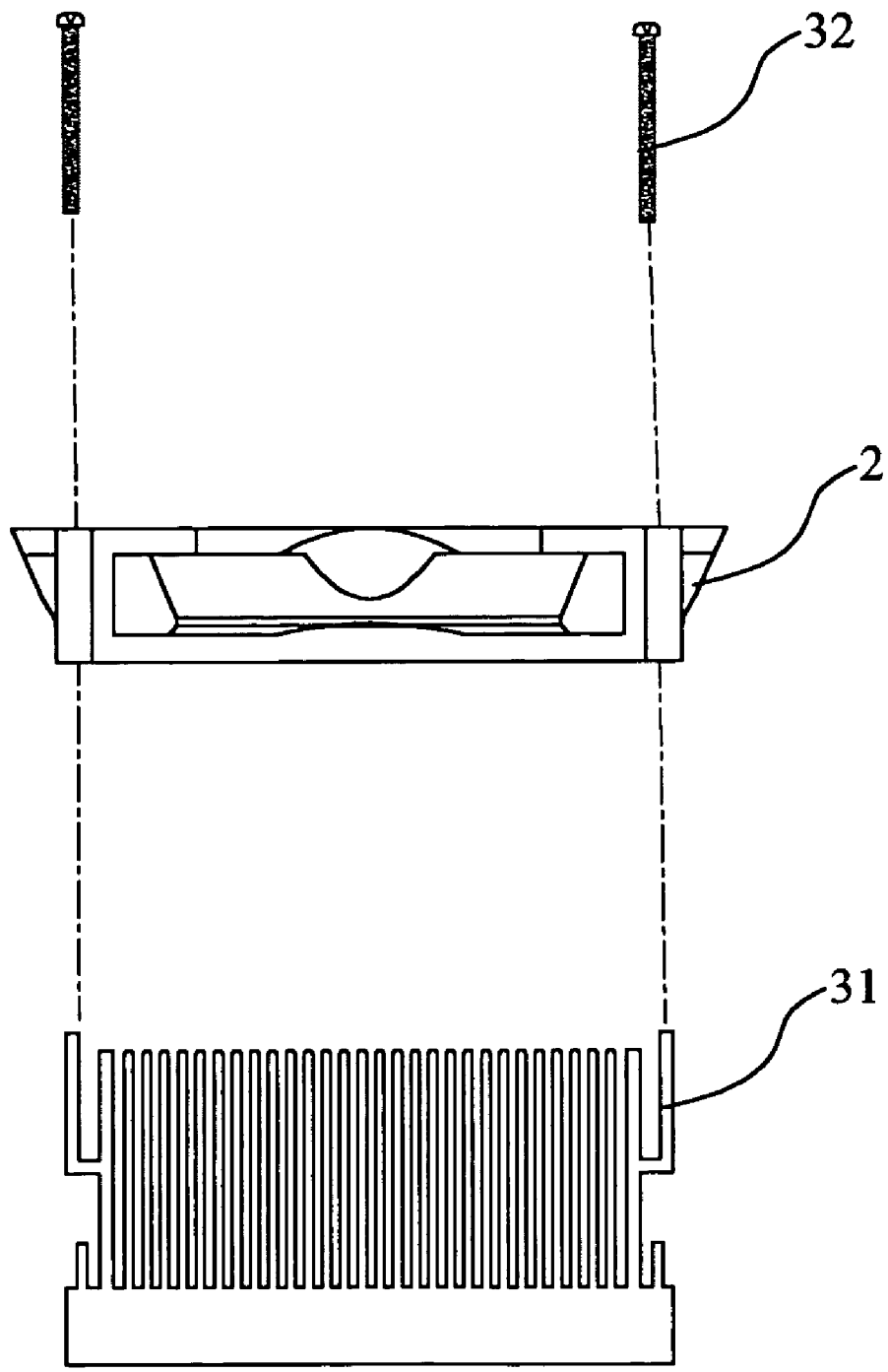
FIG. 8A is an exploded, cross-sectional view showing the assembly of the heat-dissipating device of the invention and the heat sink.
Figure 8B:
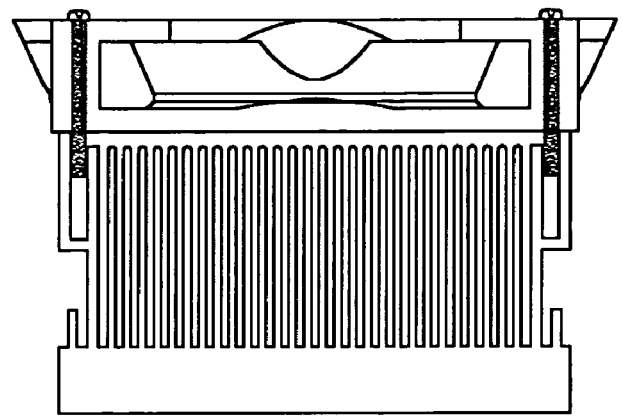
FIG. 8B is a cross-sectional view showing the combination of the heat-dissipating device and the heat sink of FIG. 8A.
Figure 8C:
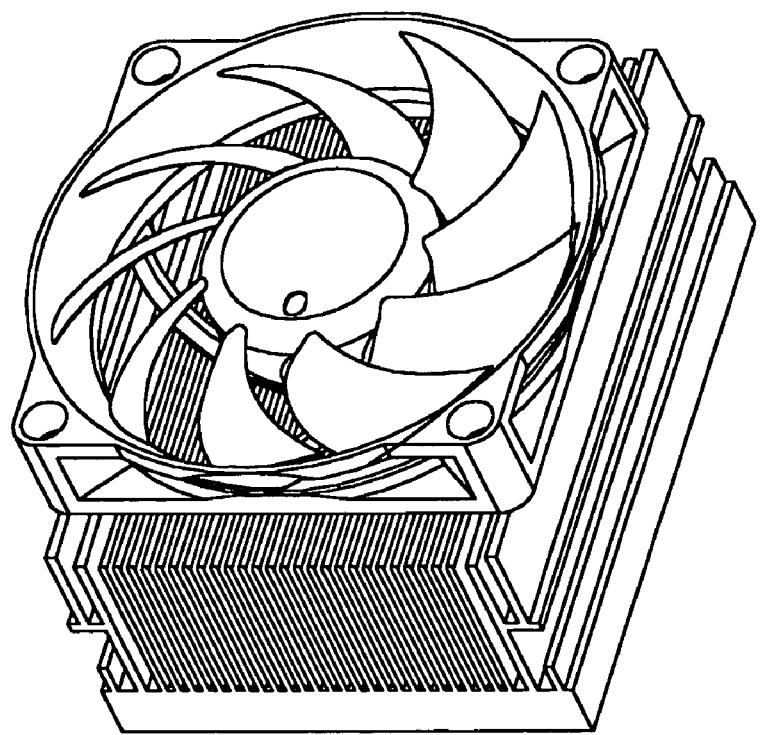
FIG. 8C is a perspective view showing the combination of the heat-dissipating device and the heat sink of FIG. 8A.
Figure 9:
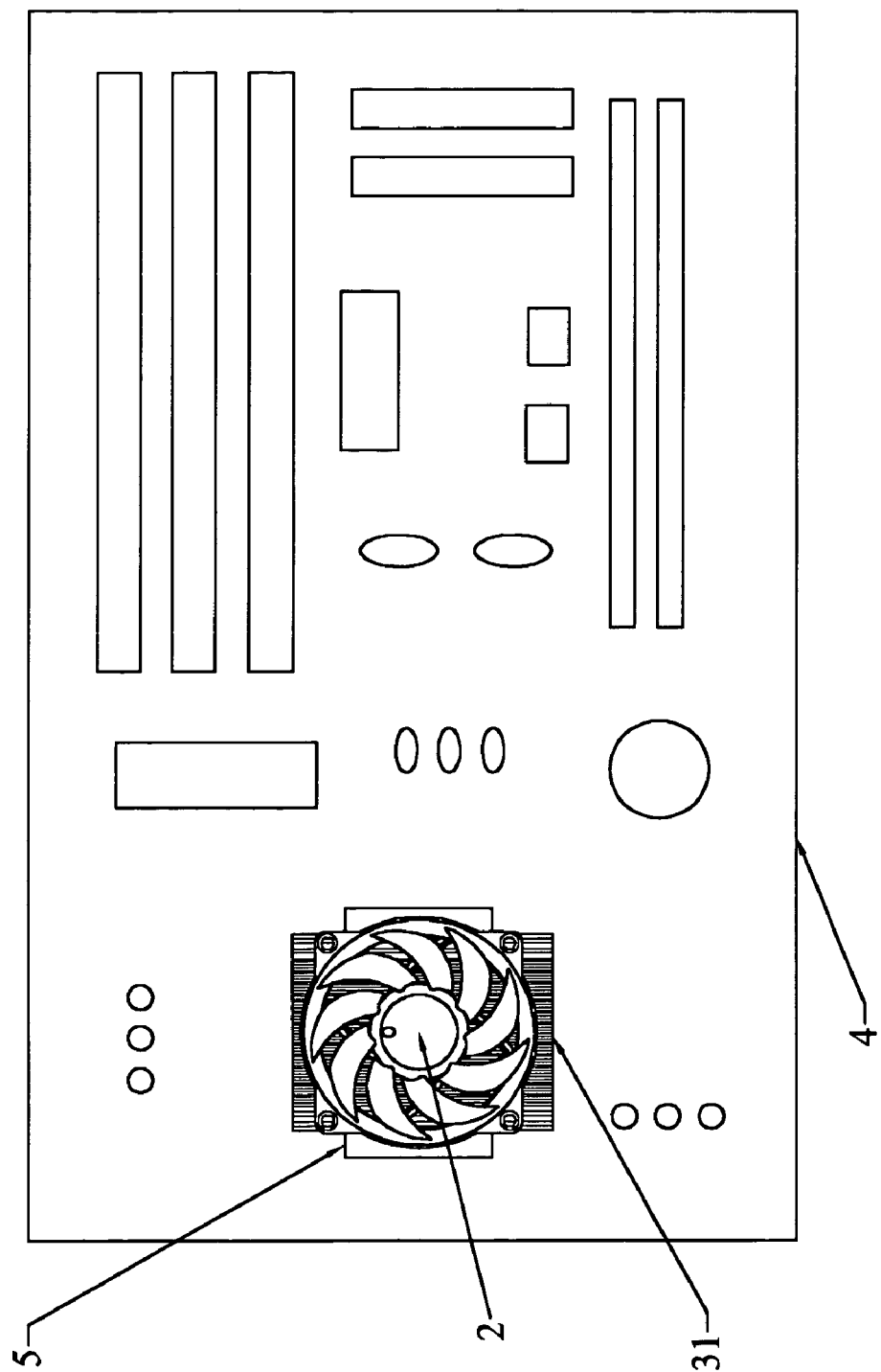
FIG. 9 is a schematic illustration showing the assembly of the heat-dissipating device of the invention and the heat sink, which is disposed in the framework with electrical elements.
Figure 10:
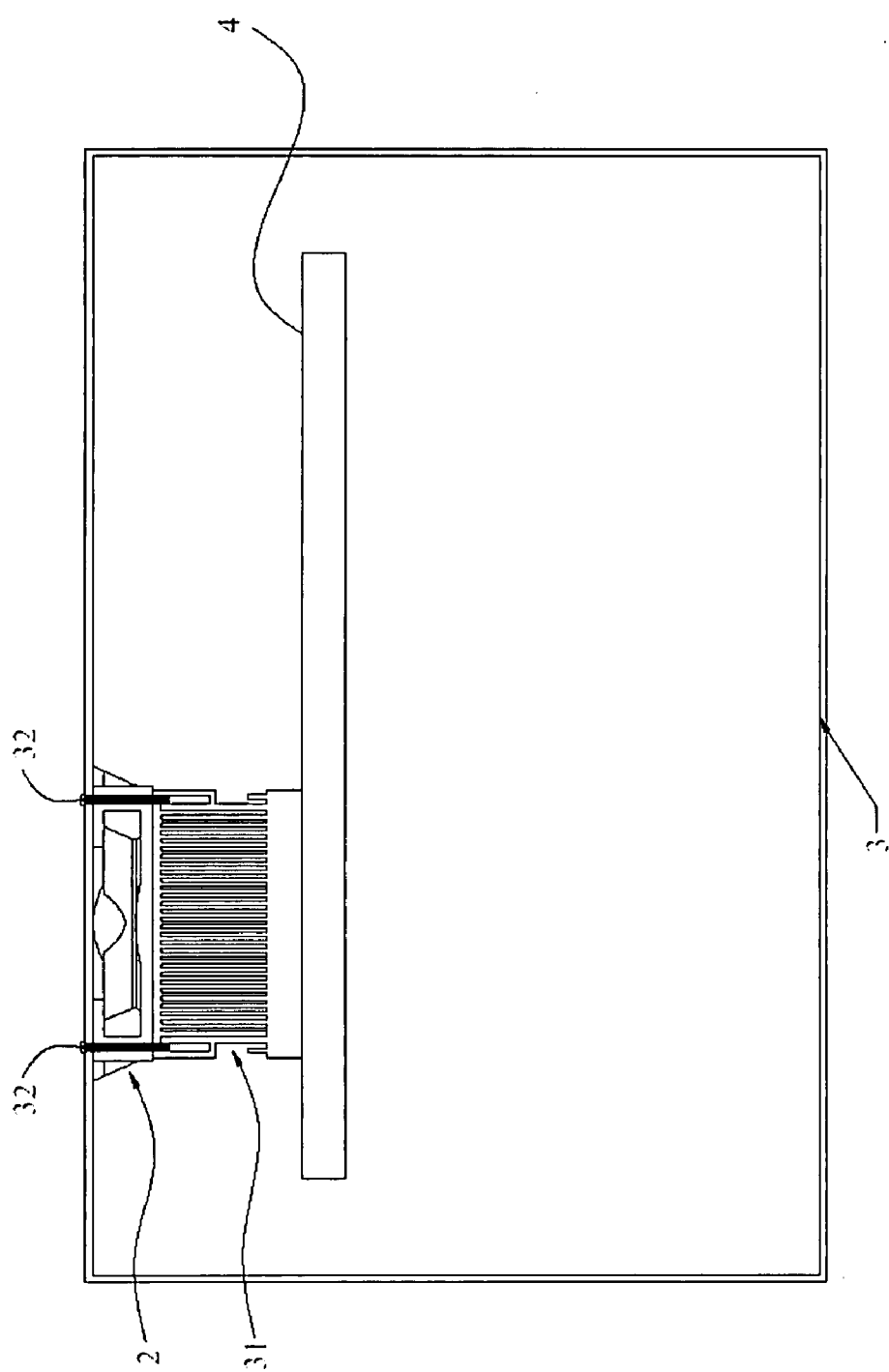
FIG. 10 is another schematic illustration showing the assembly of the heat-dissipating device of the invention and the heat sink, which is mounted on the casing.

In addition, the heat-dissipating device 2 of the invention may also be used with a heat sink 31, which may be mounted to the heat-dissipating device 2 by screws 32, as shown in FIGS. 8A to 8C. The assembly may be mounted to a central processing unit (CPU) 5, as shown in FIG. 9 and FIG. 10. That is, the bottom surface of the heat sink 31 is in close contact with the surface of the CPU 5, and the heat generated by the CPU 5 during operation may be quickly conducted to the heat sink 31. Then, the heat-dissipating device 2 produces cooling air streams to dissipate the generated heat. Moreover, the design of the inclined portion of the sidewall of the passage of the heat-dissipating device 2 of the invention may further be utilized to guide air streams toward the central portion of the heat sink having the highest temperature, and the heat-dissipating effects may be effectively achieved accordingly.

In summary, according to the aspect of the invention, the outward extension of the sidewall of the housing can greatly enlarge the air inlet area or air outlet area so as to enhance the heat-dissipating efficiency of the fan. In addition, the dimensions of the blades of the heat-dissipating fan can be enlarged along with the outward extension of the housing so that the airflow can be greatly increased and the heat-dissipating efficiency can be enhanced. Furthermore, the passage formed by the sidewall of the housing of the invention has a gradually reduced inner diameter formed from the inlet side to the outlet side (i.e., the formed passage has the inclined portion), and the air streams produced when the impeller rotates may be effectively concentrated to the central portion. Then, the air streams can directly flow toward the central portion of the heat sink having the highest temperature, and the heat-dissipating effects of the fan may be further enhanced.

While the invention has been described by way of examples and in terms of preferred embodiments, it is to be understood that the invention is not limited to the disclosed embodiments. To the contrary, it is intended to cover various modifications. Therefore, the scope of the appended claims should be accorded the broadest interpretation so as to encompass all such modifications.

The invention claimed is:

1. A heat-dissipating system comprising:
a casing;
at least one electrical element mounted within the casing; and
a heat-dissipating device mounted on or disposed within the casing for dissipating heat generated from the at least one electrical element when it operates,
wherein the heat-dissipating device includes an impeller and a housing for receiving the impeller therein, and the housing includes an outer frame having a passage for guiding air streams from one opening of the housing to another opening of the housing, and a sidewall of the passage at one of the openings radially outwardly extends with respect to an axis of the heat-dissipating device beyond a peripheral edge of the outer frame and the impeller having a blade outwardly extending along the outward extension of the sidewall so as to increase an intake/discharge area for the air streams.

2. The heat-dissipating system according to claim 1, wherein the heat-dissipating device further comprises a heat sink assembled with the housing and contacting with the at least one electrical element.

3. The heat-dissipating system according to claim 1, wherein the sidewall of the passage radially outwardly extends with respect to the axis of the heat-dissipating device in a symmetrical manner.

4. The heat-dissipating system according to claim 1, wherein the sidewall of the passage is provided with an inclined portion or a beveled edge formed therearound.

5. A heat-dissipating system, comprising:
a casing;
at least one electrical element mounted within the casing; and
a heat-dissipating device mounted on the casing for dissipating heat generated from the at least one electrical element when it operates,
wherein the heat-dissipating device further comprises:
an impeller having a plurality of blades; and
a housing for receiving the impeller therein, wherein the housing includes an air inlet, an air outlet, and an outer frame having a passage for guiding air streams from the air inlet to the air outlet, and a sidewall of the passage at the air inlet radially outwardly extends beyond a peripheral edge of the outer frame with respect to an axis of the heat-dissipating device and the blades outwardly extend along the outward extension of the sidewall so as to increase an intake area of the air streams.

6. The heat-dissipating system according to claim 5, wherein a radially outward extension of the sidewall of the passage is partially cut off to form a notch in order to increase a lateral intake area for the air streams.

7. The heat-dissipating system according to claim 5, wherein the sidewall of the passage at the air inlet radially outwardly extends with respect to the axis of the heat-dissipating device in a symmetrical manner and beyond a peripheral edge of the housing.

8. The heat-dissipating system according to claim 5, wherein an sidewall of the passage is provided with an inclined portion.

9. The heat-dissipating system according to claim 5, wherein the sidewall of the passage is provided with an inclined portion extending from the air inlet to the air outlet.

10. The heat-dissipating system according to claim 5, wherein the sidewall of the passage at the air outlet radially extends inwardly with respect to the axis of the heat-dissipating device.

11. The heat-dissipating system according to claim 10, wherein the sidewall of the passage at the air inlet and at the air outlet are arranged in a symmetrical manner.

12. The heat-dissipating system according to claim 5, wherein the passage is a circle form or an ellipse form.

13. A heat-dissipating system comprising:
a casing;
at least one electrical element mounted within the casing; and a heat-dissipating device mounted on or disposed within the casing for dissipating heat generated from the at least one electrical element when it operates, wherein the heat-dissipating device further comprises:

an impeller and a housing for receiving the impeller therein, wherein the housing includes an outer frame having a passage for guiding air streams from one opening to another opening of the housing, and a sidewall of the passage at one of the openings radially outwardly extends beyond a peripheral edge of the outer frame with respect to an axis of the heat-dissipating device in a symmetrical manner.

14. The heat-dissipating system according to claim 13, wherein the heat-dissipating device further comprises a heat sink assembled with the housing and contacting with the at least one electrical element.

15. The heat-dissipating system according to claim 13, wherein the sidewall of the passage is provided with an inclined portion or a beveled edge formed therearound.

16. The heat-dissipating system according to claim 13, wherein a radially outward extension of the sidewall of the passage is partially cut off to form a notch in order to increase a lateral intake area for the air streams.

17. The heat-dissipating system according to claim 13, wherein the sidewall of the passage is provided with an inclined portion extending from the air inlet to the air outlet.

18. The heat-dissipating system according to claim 13, wherein the sidewall of the passage at the air outlet radially extends inwardly with respect to the axis of the heat-dissipating device.

19. The heat-dissipating system according to claim 13, wherein the passage is a circle form or an ellipse form.

* * * * *